United States Patent
Belyansky et al.

(10) Patent No.: US 9,397,002 B1
(45) Date of Patent: Jul. 19, 2016

(54) SELF-ALIGNED PUNCHTHROUGH STOP DOPING IN BULK FINFET BY REFLOWING DOPED OXIDE

(71) Applicant: International Business Machines Corporation, Armonk, NY (US)

(72) Inventors: Michael P. Belyansky, Clifton Park, NY (US); Kangguo Cheng, Schenectady, NY (US); Ramachandra Divakaruni, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/947,081

(22) Filed: Nov. 20, 2015

(51) Int. Cl.
  *H01L 29/10* (2006.01)
  *H01L 21/8234* (2006.01)
  *H01L 27/088* (2006.01)
  *H01L 21/324* (2006.01)

(52) U.S. Cl.
  CPC ...... *H01L 21/823412* (2013.01); *H01L 21/324* (2013.01); *H01L 21/823431* (2013.01); *H01L 21/823481* (2013.01); *H01L 27/0886* (2013.01); *H01L 29/1083* (2013.01)

(58) Field of Classification Search
  CPC .................. H01L 21/02109; H01L 21/02296; H01L 21/8232; H01L 29/66007
  See application file for complete search history.

(56) References Cited

U.S. PATENT DOCUMENTS

| | | |
|---|---|---|
| 7,187,046 B2 | 3/2007 | Wu et al. |
| 8,043,884 B1 | 10/2011 | Nieh et al. |
| 8,106,459 B2 | 1/2012 | Chang et al. |
| 8,679,958 B2 | 3/2014 | Takamure et al. |
| 9,054,193 B2 | 6/2015 | Yin et al. |
| 9,070,771 B2 | 6/2015 | Reznicek et al. |
| 9,082,853 B2 | 7/2015 | Cheng et al. |
| 9,087,860 B1 | 7/2015 | Banghart et al. |
| 2015/0017794 A1 | 1/2015 | Takamure et al. |
| 2015/0084127 A1 | 3/2015 | Zhu |
| 2015/0144877 A1 | 5/2015 | Mears et al. |
| 2015/0228668 A1 | 8/2015 | Ponoth et al. |

FOREIGN PATENT DOCUMENTS

CN 104112665 A 10/2014

*Primary Examiner* — Cheung Lee
(74) *Attorney, Agent, or Firm* — Cantor Colburn LLP; Vazken Alexanian

(57) ABSTRACT

A technique relates to punchthrough stop (PTS) doping in bulk fin field effect transistors. Fins are formed on a substrate, and each pair of the fins has a fin pitch. Each of the fins has an undoped fin channel and a punchthrough stop doping region underneath the undoped fin channel. A narrow shallow trench isolation trench is formed between the fin pitch of the fins. A wide shallow trench isolation trench is formed at an outside edge of the fins. A doped layer fills the narrow shallow trench isolation trench and the wide shallow trench isolation trench. A vertical thickness of the doped layer in the narrow shallow trench isolation trench is greater than a vertical thickness of the wide shallow trench isolation trench.

10 Claims, 9 Drawing Sheets

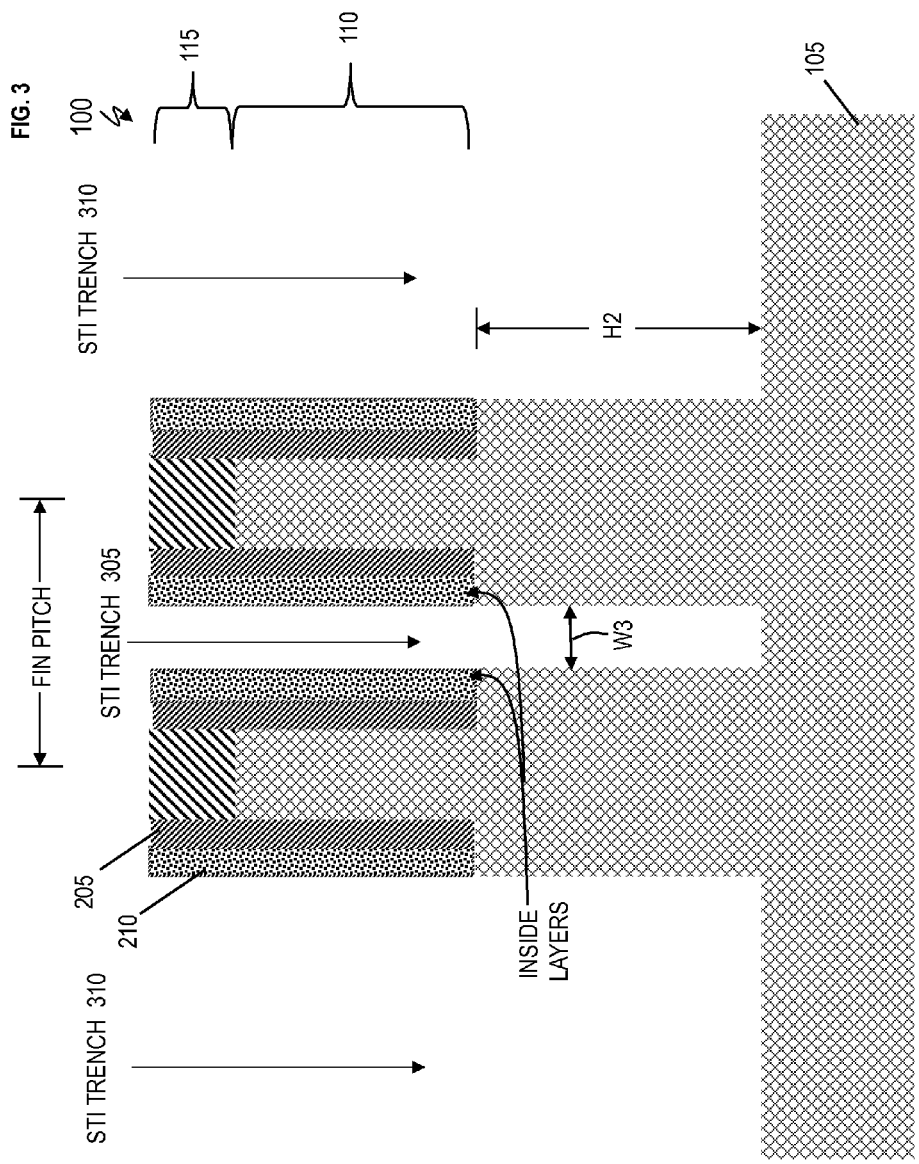

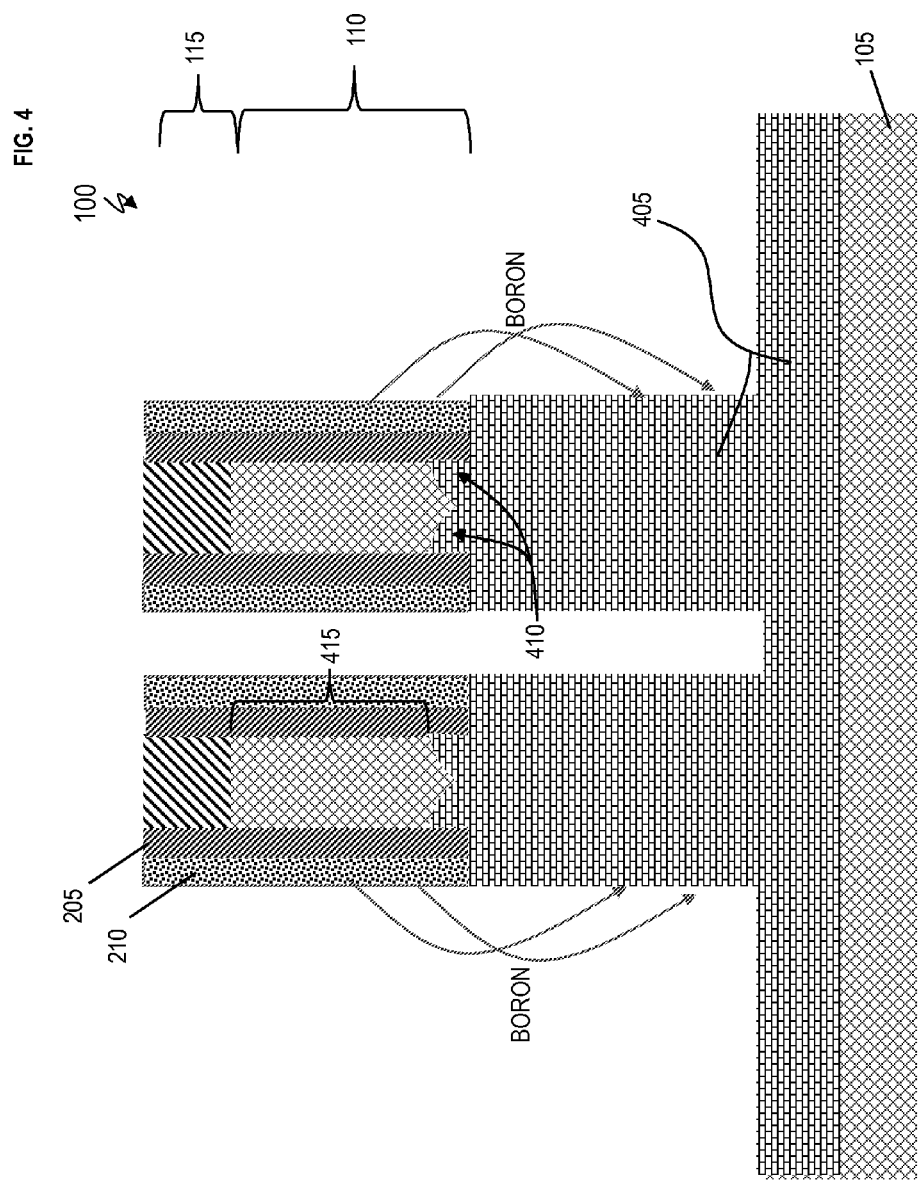

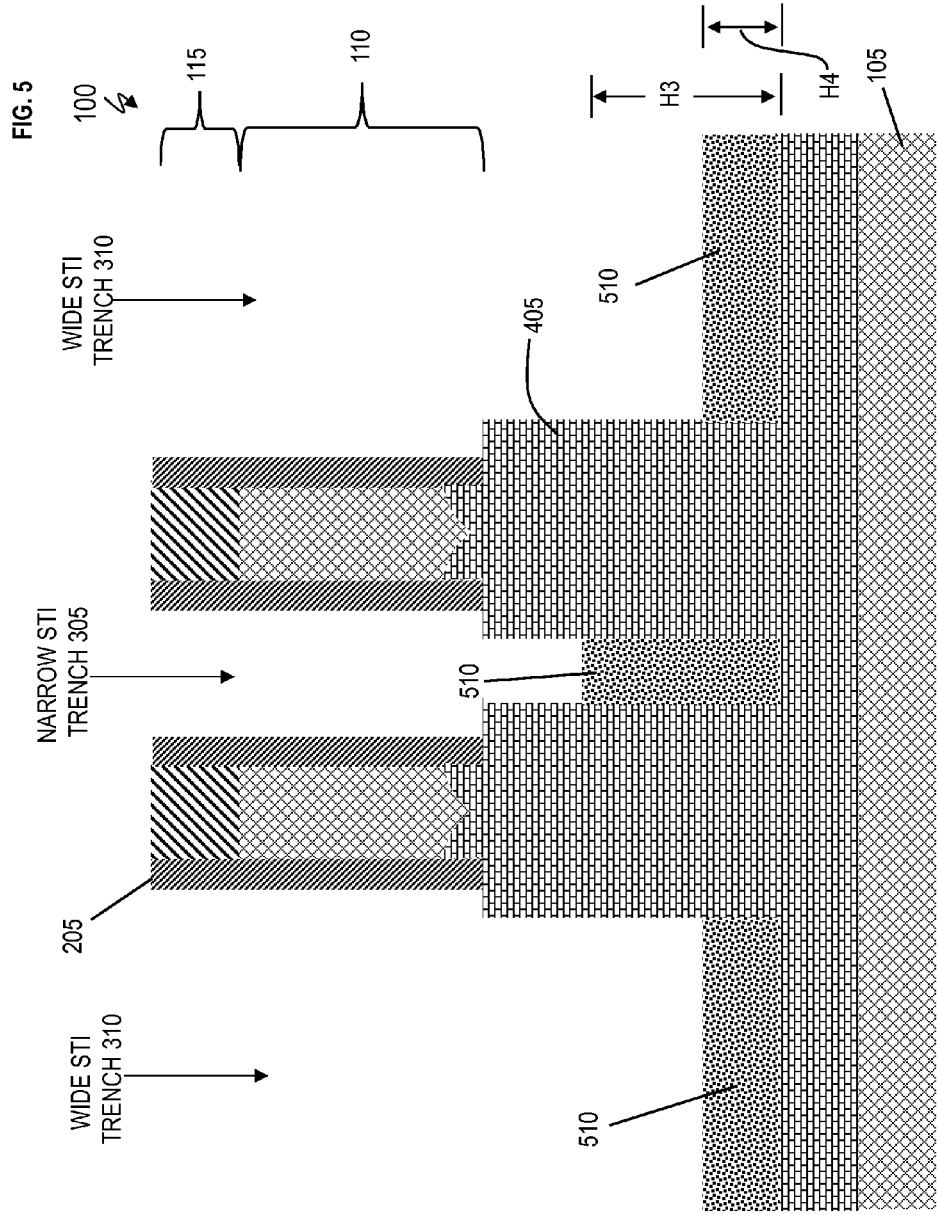

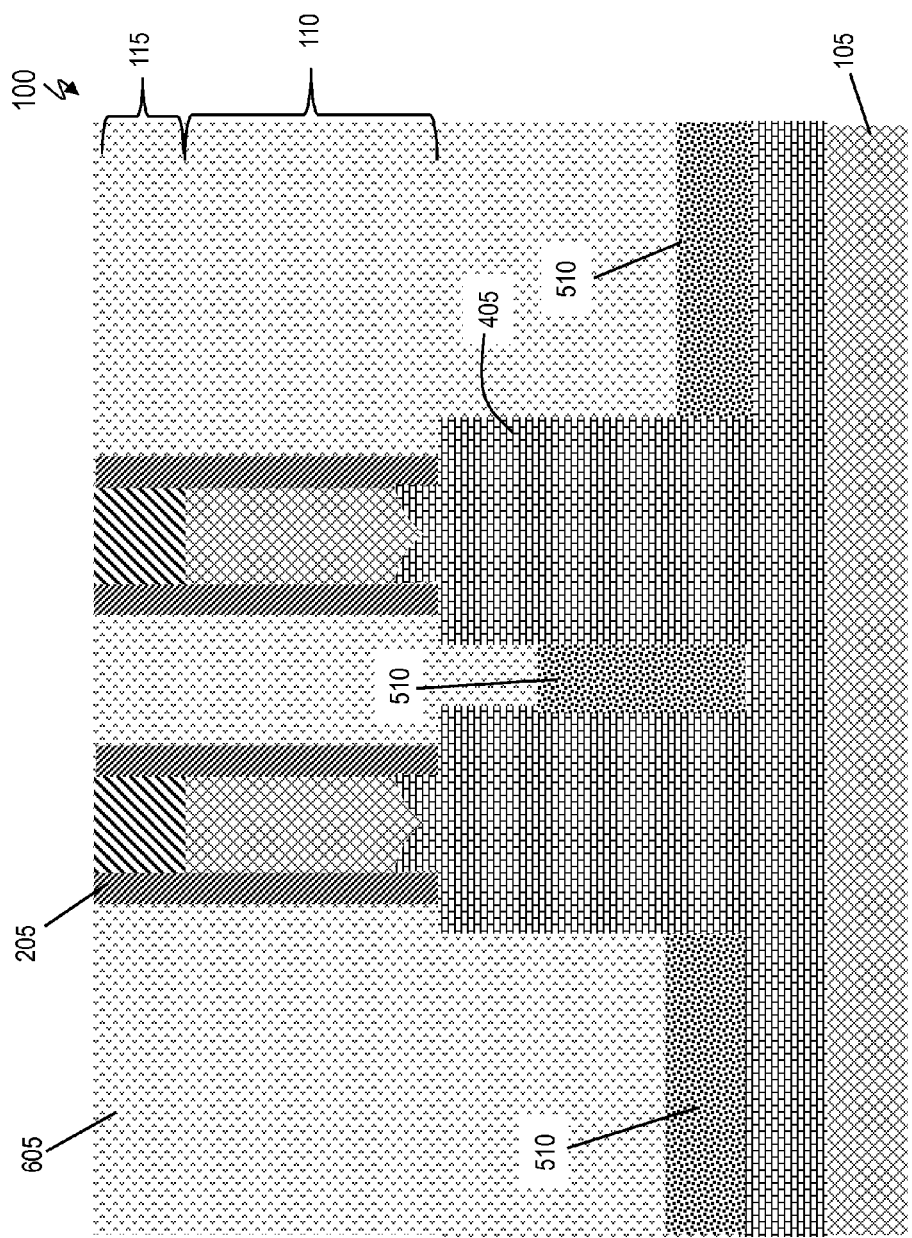

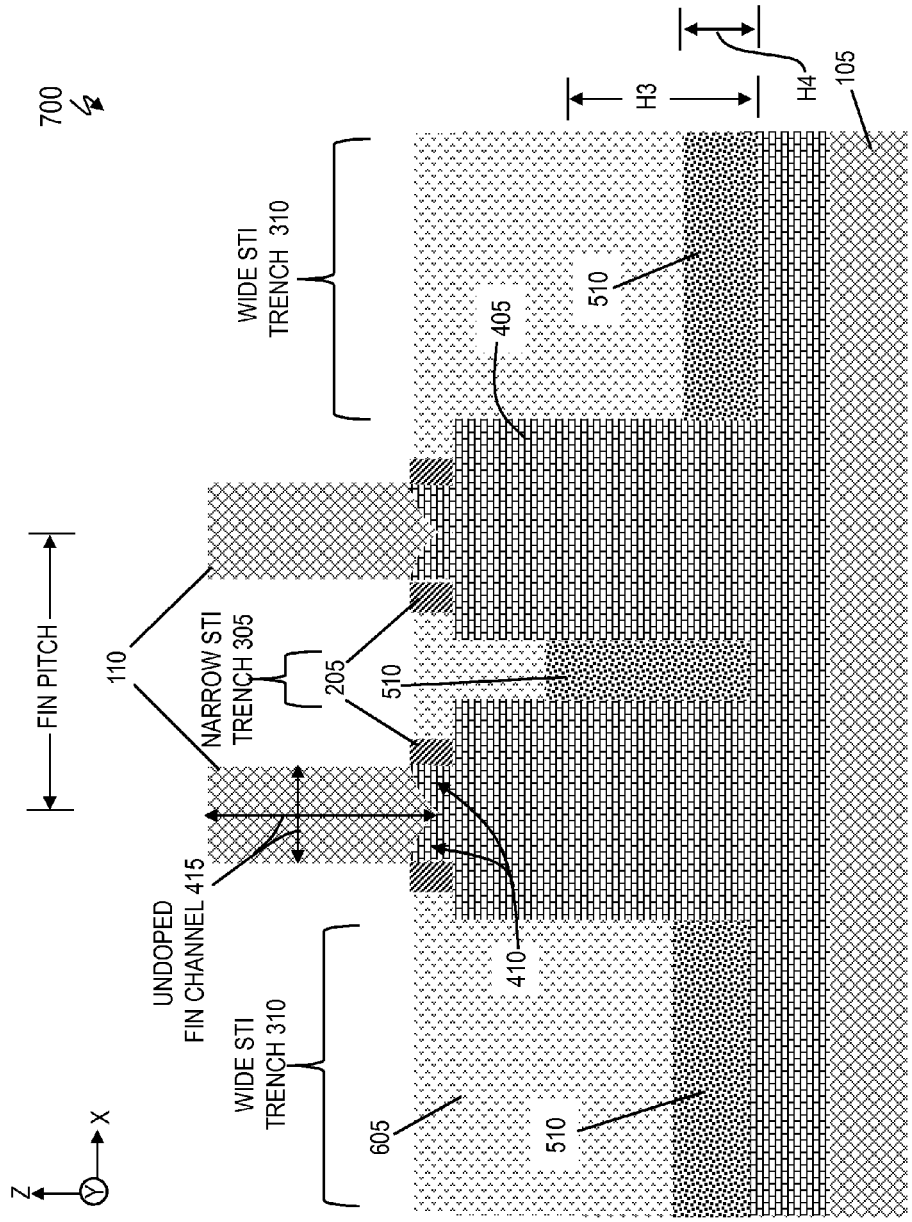

FORM FINS ON A SUBSTRATE, WHEREIN THE FINS HAVE A HARDMASK ON TOP  805

FORM SPACERS ON FIN SIDEWALLS OF THE FINS  810

FORM A DOPED LAYER ON SPACER SIDEWALLS OF THE SPACERS, WHEREIN THE DOPED LAYER INCLUDES DOPANTS  815

ETCH THE SUBSTRATE TO FORM SHALLOW TRENCH ISOLATION TRENCHES IN THE SUBSTRATE  820

ANNEAL TO DRIVE THE DOPANTS FROM THE DOPED LAYER INTO THE SUBSTRATE INCLUDING LOWER PORTIONS OF THE FINS, THEREBY FORMING A PUNCHTHROUGH STOP DOPING REGION, WHEREIN AN UPPER PORTION OF THE FINS IS PROTECTED FROM THE DOPANTS BY THE SPACERS ON THE FIN SIDEWALLS AND THE HARDMASK ON TOP OF THE FINS  825

ANNEAL TO REFLOW THE DOPED LAYER TO FILL THE SHALLOW TRENCH ISOLATION TRENCHES IN THE SUBSTRATE, SUCH THAT DOPED MATERIAL OF THE DOPED LAYER AT LEAST PARTIALLY FILLS THE SHALLOW TRENCH ISOLATION TRENCHES  830

FIG. 8B

FORM AN UNDOPED OXIDE LAYER TO COMPLETELY FILL THE SHALLOW TRENCH ISOLATION TRENCHES 835

REMOVE THE SPACERS ON THE FIN SIDEWALLS AND THE HARDMASK ON TOP OF THE FINS 840

SELF-ALIGNED PUNCHTHROUGH STOP DOPING IN BULK FINFET BY REFLOWING DOPED OXIDE

BACKGROUND

The present invention relates generally to the field of semiconductor devices, and more specifically, to fabrication of a structure and method of forming self-aligned punchthrough stop (PTS) doping in bulk finFET by reflowing doped oxide.

In using field effect transistors in the formation of ultra large scale integrated circuit devices, punchthrough has increasingly become an issue. Punchthrough ion implantations have been used near the source and drain to reduce the electric field in the channel thereby increasing the punchthrough voltage. These methods have had the problem of increasing the source and drain capacitance thereby adversely effecting device performance.

The term finFET refers to a field effect transistor (FET) with fins. In one case, the finFET is used to describe a non-planar, double-gate transistor that may be built on a silicon-on-insulator (SOI) substrate. The distinguishing characteristic of the finFET is that the conducting channel is wrapped by a thin silicon "fin", which forms the body of the device. The thickness of the fin (measured in the direction from source to drain) determines the effective channel length of the device. The wrap-around gate structure provides a better electrical control over the channel and thus helps in reducing the leakage current and overcoming other short-channel effects.

SUMMARY

According to one embodiment, a method of forming punchthrough stop (PTS) doping for bulk fin field effect transistors is provided. The method includes forming fins on a substrate, where the fins have a hardmask on top, forming spacers on fin sidewalls of the fins, forming a doped layer on spacer sidewalls of the spacers, where the doped layer includes dopants, etching the substrate to form shallow trench isolation trenches in the substrate, and annealing to drive the dopants from the doped layer into the substrate including lower portions of the fins, thereby forming a punchthrough stop doping region, An upper portion of the fins is protected from the dopants by the spacers on the fin sidewalls and the hardmask on top of the fins. Also, the method includes annealing to reflow the doped layer to fill the shallow trench isolation trenches in the substrate, such that doped material of the doped layer at least partially fills the shallow trench isolation trenches, forming an undoped oxide layer to completely fill the shallow trench isolation trenches, and removing the spacers on the fin sidewalls and the hardmask on top of the fins.

According to one embodiment, a semiconductor device having punchthrough stop (PTS) doping in bulk fin field effect transistors. The device includes fins formed on a substrate, each pair of the fins having a fin pitch, where each of the fins has an undoped fin channel and a punchthrough stop doping region underneath the undoped fin channel. The device includes a narrow shallow trench isolation trench formed between the fin pitch of the fins, a wide shallow trench isolation trench formed at an outside edge of the fins, and a doped layer filling the narrow shallow trench isolation trench and the wide shallow trench isolation trench. A vertical thickness of the doped layer in the narrow shallow trench isolation trench is greater than a vertical thickness of the wide shallow trench isolation trench.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

FIG. 3 is a cross-sectional view of the intermediate device illustrating etching the substrate to form shallow trench isolation (STI) trenches according to an embodiment.

FIG. 4 is a cross-sectional view of the intermediate device illustrating thermal annealing to form punchthrough stop (PTS) doping according to an embodiment.

FIG. 5 is a cross-sectional view of the intermediate device illustrating thermal annealing to reflow the doped oxide layer according to an embodiment.

FIG. 6 is a cross-sectional view of the intermediate device illustrating disposing undoped oxide to fill the top portions of a narrow STI trench and wide STI trenches according to an embodiment.

FIG. 7 is a cross-sectional view of a resultant device that reveals the fins according to an embodiment.

FIGS. 8A and 8B together illustrate a flow chart of a method of forming punchthrough stop (PTS) doping for bulk fin field effect transistors according to an embodiment.

DETAILED DESCRIPTION

A finFET semiconductor device is a field effect transistor in which the body of the field effect transistor contains the channel in a fin structure. As used herein, a fin structure or finFET device refers to a semiconductor material that is employed as the body of a semiconductor device, in which the gate structure is positioned around the fin structure such that charge flows down the channel on the two sidewalls of the fin structure and optionally along the top surface of the fin structure.

Punchthrough stop (PTS) doping is useful for bulk finFET. One issue with bulk finFET devices is the difficulty in forming robust shallow trench isolation (STI), which has an increasingly high aspect ratio due to fin pitch scaling.

FIGS. 1-7 illustrate a process of fabricating a finFET structure having self-aligned punchthrough stop (PTS) doping in bulk finFET by reflowing doped oxide according to an embodiment. Bulk finFET means finFET formed on a bulk semiconductor substrate such as a bulk silicon wafer. The semiconductor fin physically connects to the bulk substrate.

Figure 1:
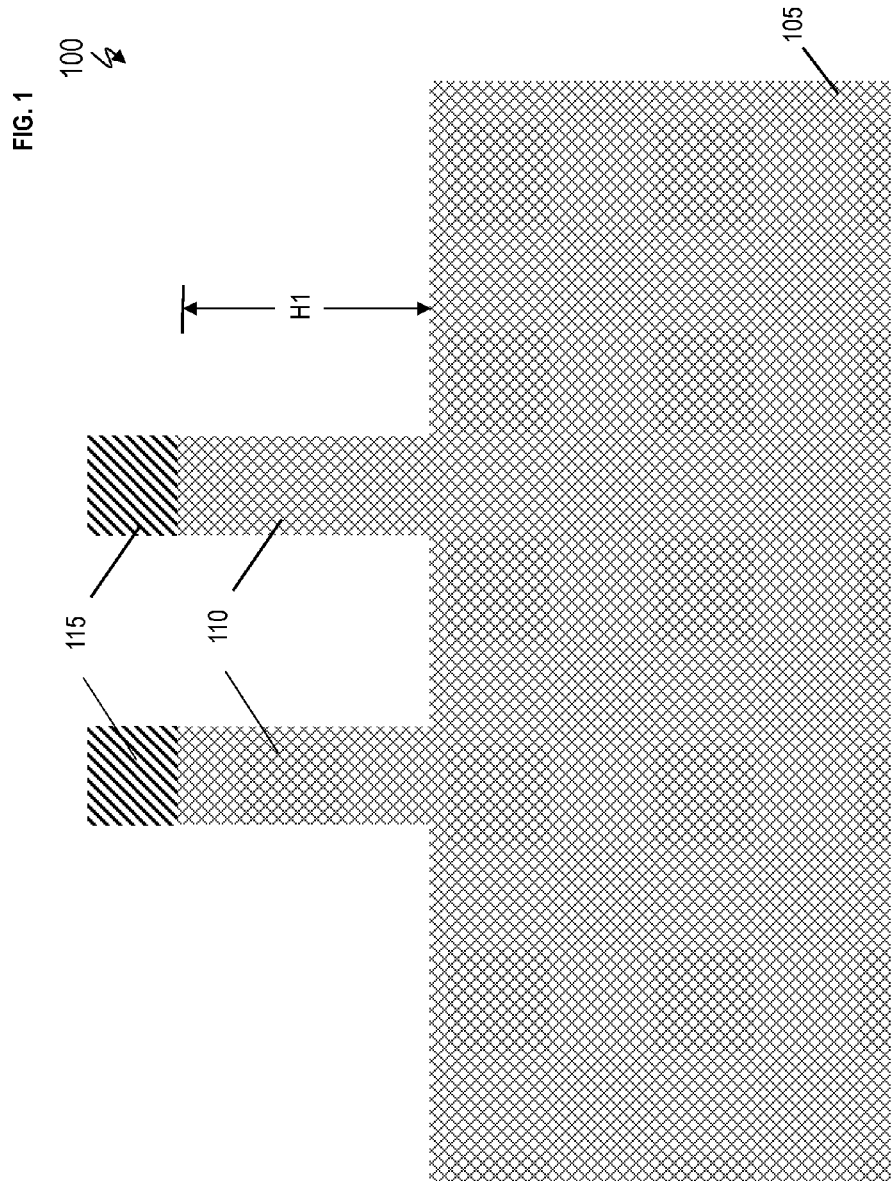
FIG. 1 is a cross-sectional view of an intermediate device with fins according to an embodiment.

FIG. 1 is a cross-sectional view of an intermediate device 100 according to an embodiment. FIG. 1 illustrates a substrate with fins 110 formed on top. A hardmask 115 is formed on top of the fins 110. Example materials of the bulk substrate 105 (forming the fins 110) may include silicon, germanium, silicon germanium, etc. Example materials of the hardmask 115 may include silicon nitride, silicon dioxide, silicon oxynitride, and/or any suitable combination of those materials. In one implementation, the height H1 of the fins 110 may range from about 25-50 nanometers (nm).

The fins 110 may be formed using lithography or sidewall transfer. The intermediate device 100 may start with a bulk substrate 105, such as a silicon wafer. Fins 110 are formed out of the substrate 105. The fins 110 may be formed by sidewall imaging transfer or any other suitable patterning techniques such as lithography followed by etch. For example, a sacrificial layer (not shown) may be deposited and patterned on the substrate 105, and a hardmask layer may be deposited on the sacrificial layer. The hardmask layer is etched back into a pattern, and the sacrificial layer is removed leaving the hardmask 115 on top of the substrate 105. The substrate 105 is etched down a depth of the height H1, and the hardmask 115 protects the part of the substrate 105 not etched such that the fins 110 are formed. This leaves the hardmask 115 on top of the fins 110.

Figure 2:
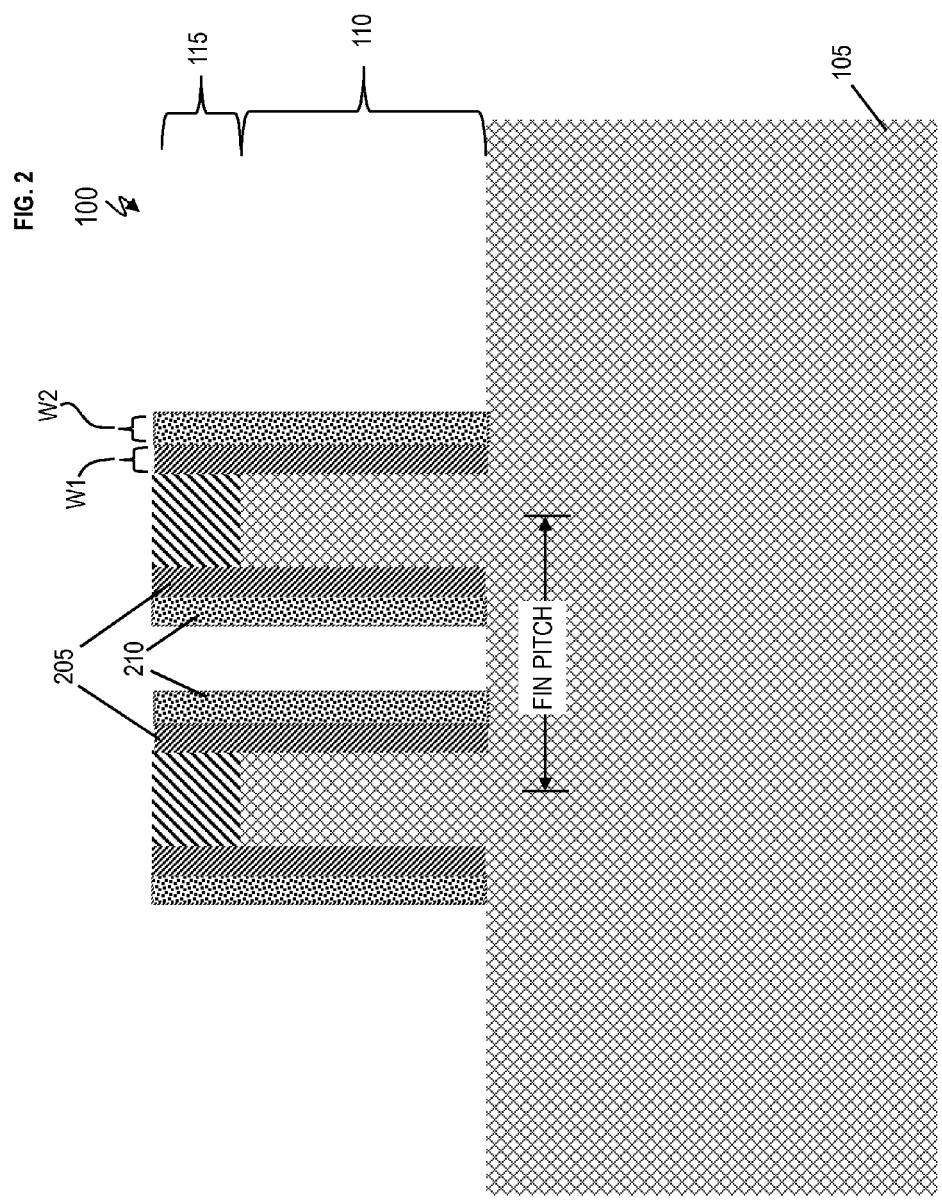
FIG. 2 is a cross-sectional view of the intermediate device illustrating forming first and second spacer layers on the fin sidewalls of the fins according to an embodiment.

FIG. 2 is a cross-sectional view of the intermediate device 100 illustrating forming first and second spacer layers on the fin sidewalls of the fins 110 according to an embodiment. In FIG. 2, a first spacer layer 205 is formed on the fin sidewalls of the fins 110 by depositing the first spacer material on top of the intermediate device 100 such as on top of the substrate 105, and along the sides of the fins 110 and hardmask 115. Part of the first spacer material is etched away to leave the first spacer layer 205 on the sidewalls of the fins 110, partly on the substrate 105, and on the sides of the hardmask 115. The first spacer material may be etched using reactive ion etching (RIE). Examples of the first spacer material of the first spacer layer 205 may include silicon nitride, silicon oxynitride, silicon nitride on top of a silicon oxide. In one implementation, the width W1 of the first spacer layer 205 may be about 3-10 nanometers (nm).

A second spacer layer 210 is formed on the fin sidewalls to be placed on top of the first spacers 205. The second spacer material is deposited on top of the substrate 105 and on sides of the first spacer layers 205. Part of the second spacer material is etched away (e.g., using RIE) to leave the second spacer layer 210 on the first spacer layer 205 and partly on the substrate 105. The second spacer material of the second spacers 210 may be doped oxide spacers. In one implementation, the doped oxide spacer layer 210 (i.e., second spacer layer) may be boron-doped silicate glass (BSG). For example, the second spacer layer 210 may be any oxide doped with boron. Other examples of dopants for the doped oxide spacer layer 210 may include phosphorus doped oxide, arsenic doped oxide, boron doped oxide, phosphorus doped silicate glass (PSG), arsenic doped silicate glass (ASG). In one implementation, the width W2 of the second spacer layer 210 may be about 3-10 nanometers (nm).

FIG. 3 is a cross-sectional view of the intermediate device 100 illustrating etching the substrate 105 to form shallow trench isolation (STI) trenches according to an embodiment. As one example, reactive ion etching (RIE) may be utilized to form the narrow STI trenches 305 and wide STI trenches 310. The etching selectively etches the substrate 105 (e.g., silicon) while not etching the hardmask 115, the first spacer layer 205, and the second spacer layer 210. Accordingly, the hardmask 115, the first spacer layer 205, and the second spacer layer 210 protect the fins 110 from the etching. In one implementation, the width W3 of the narrow STI trench 305 may be about 10-40 nm.

FIG. 4 is a cross-sectional view of the intermediate device 100 illustrating thermal annealing to form punchthrough stop (PTS) doping according to an embodiment. FIG. 4 illustrates that the dopant, e.g., boron, diffuses from the doped oxide layer 210 (i.e., the second spacer layer) into the substrate 105 (e.g., silicon), thereby forming the doped region of the substrate 105 referred to as the doped region or punchthrough stop doping region 405. The fins 110 are protected by the first spacer layer 205 (e.g., silicon nitride spacers) such that the fins 110 remain undoped (e.g., undoped silicon). For example, the large upper portions 415 of the fins 110 remain undoped while smaller lower portions 410 are doped as the punchthrough stop doping region 405. It is noted that 'undoped' such as the undoped fin (e.g., undoped lart upper portions 415) means the doping concentration in the fin is less than $1e^{17}/cm^3$.

In one implementation, the thermal anneal to form the punchthrough stop doping region 405 may have a temperature between 700-1100° Celsius (C) for a few seconds to a few hours, such that the dopants penetrate and diffuse into the substrate 105.

In FIG. 4, the punchthrough stop region 405 (having been doped) is directly underneath and self-aligned to the spacer 205 which blocks dopant diffusion into fin portion 415 that will be used as the channel of the finFET.

FIG. 5 is a cross-sectional view of the intermediate device 100 illustrating thermal annealing to reflow the doped oxide layer 210 according to an embodiment. The thermal annealing in FIGS. 4 and 5 may occur simultaneously in one implementation. In another, implementation the thermal annealing in FIGS. 4 and 5 may separately occur.

In FIG. 5, the intermediate device 100 is heated to a temperature that causes the doped oxide spacer layer 210 (e.g., BSG) to reflow into the wide STI trenches 310 and the narrow STI trench 305 as reflow layer 510. The doped oxide layer 210 has a low reflow temperature. The wide STI trenches 310 are filled by the reflow layer 510 (e.g., BSG) at the bottom. The narrow STI trench 305 is filled higher by the reflow layer 510. For example, for a pair of fins 110, the two inside doped oxide spacer layers 210 (within the fin pitch) flow (because of gravity) into the narrow STI trench 305 to fill the narrow STI trench 305 with the reflow layer 510 at a height H3. Each outside oxide layer 210 (outside the fin pitch) individually flows into respective wide STI trenches 310 to fill the bottom of the wide STI trenches 310 with the reflow layer 510 at a height H4. The height H3 is higher that height H4. In one implementation, the height H3 may be twice the height H4. In an implementation, the height H3 of the reflow layer 510 in the narrow STI trench 305 may be about 20-80 nm.

FIG. 6 is a cross-sectional view of the intermediate device 100 illustrating disposing an undoped oxide layer 605 to fill the top portions of the narrow STI trench 305 and wide STI trenches 310 according to an embodiment. The undoped oxide layer 605 may be disposed on top of the intermediate device 100, such that the reflow layer 510, the punchthrough stop region 405, the first spacer layer 205, and the hardmask 115 are covered. The undoped oxide layer 605 may be high density plasma (HDP) chemical vapor deposited oxide (also referred to as HDP oxide), flowable oxide (FOX), or any other oxide deposited by any suitable techniques such as chemical vapor deposition (CVD). The undoped oxide layer 605 is planarized, e.g., by chemical mechanical polishing/planarization (CMP), to be coplanar with the top of the hardmask 115 and first spacer layer 205.

FIG. 7 is a cross-sectional view of the resultant device 700 that reveals the fins 110 according to an embodiment. The resultant device 700 is a finFET structure having self-aligned punchthrough stop (PTS) doping under the fins 110.

The undoped oxide layer 605 (e.g., HDP oxide) is recessed. For example, the undoped oxide layer 605 may be etched in the regions of the narrow STI trench 305 and wide STI trenches 310.

The hardmasks 115 on top of the fins 110 and the first spacer layer 205 on the fin sidewalls are stripped. Etchants used to strip the hardmask layers 115 (e.g., silicon nitride) and first spacer layer 205 (e.g., silicon nitride) may include phosphoric acid and/or hydrofluoric acid. A small portion of the spacer layer 205 may remain, coplanar with or slightly below the recessed oxide layer 605 when silicon nitride covered by the recessed oxide layer 605 is partially protected by the oxide during nitride etch. The small portion of the spacer layer 205 may abut side and upper portions of the punchthrough stop doping region 405.

The resultant device 700 has the fins 110 with the self-aligned punchthrough stop doping region 405 underneath and has different oxide levels of the reflow layer 510 in the narrow STI trench 305 (at height H3) versus wide STI trenches 310 (at height H4). The doped oxide spacer layer 210 (e.g., BSG) serves two purposes: (1) dopant sources for forming the punchthrough stop doping region 405 below, and (2) filling the lower portion of the narrow STI trench 305 portions. When the lower portion of the narrow STI trench 305 is filled by BSG, it reduces the aspect ratio of the remaining trench (aspect ratio=trench height/trench width), easing the subsequent STI filling process. Without BSG filling the lower portion of the STI, it would be more difficult to fill the STI trench (high aspect ratio) without forming voids in STI. Voids in STI is bad (i.e., defect) for devices.

The fin pitch between fins 110 is decreasing as technology evolves. Example fin pitches of the resultant device 700 may range from about 20-80 nm. With a narrow fin pitch, the narrow STI trench 305 has a narrow width W3 that is filled with reflow layer 510 by the reflow of the doped oxide layer 210 (e.g., BSG). State-of-the-art systems would have difficulty filling the narrow STI trench.

Although only two fins 110 are illustrated for explanation purposes, it should be appreciated that the fabrication process simultaneously occurs for numerous pairs fins 110 (4, 6, 8, . . . 20, etc.) simultaneously on a wafer. Additionally, other fins 110 are formed in pairs to the left and right in the x-axis, such that each pair of fins 110 has a fin pitch separating each other with a narrow shallow trench isolation trench in between. The fins 110 are elongated in the y-axis such that each fin 110 connects to a source and drain, as understood by one skilled in the art. The wide STI trenches 310 separate each pair of fins 110 from another pair of fins 110.

Utilizing the resultant device 700, it should be appreciated that finFET fabrication continues. Other fabrication processes (not shown) to may include forming gates, source/drain, spacers, contacts, and wiring.

FIGS. 8A and 8B together illustrates a flow chart 800 of a method of forming punchthrough stop (PTS) doping for bulk fin field effect transistors according to an embodiment.

At block 805, fins 110 are formed on the substrate 105, where the fins 110 have a hardmask 115 on top. An example is depicted in FIG. 1.

At block 810, spacers 205 are formed on fin sidewalls of the fins 110. At block 815, the doped layer 210 are formed on spacer sidewalls of the spacers 205, where the doped layer 210 includes dopants (e.g., such as boron, phosphorus, and/or arsenic). FIG. 2 depicts an example.

At block 820, the substrate 105 is etched to form shallow trench isolation trenches (i.e., the narrow STI trenches 305 and the wide STI trenches 310) in the substrate 105. An example is depicted in FIG. 3.

At block 825, thermal annealing is performed to drive the dopants from the doped layer 210 into the substrate 105 including lower portions 410 of the fins 110, thereby forming a punchthrough stop doping region 405, where an upper portion 415 (i.e., the undoped fin channel) of the fins 110 is protected from the dopants by the spacers 205 on the fin sidewalls and the hardmask 115 on top of the fins 110. FIG. 4 is depicts an example. 'Undoped fin channel' means the doping concentration in that portion of the fin is approximately less than $1e^{17}/cm^3$.

At block 830, thermal annealing is performed to reflow the doped layer 210 (shown as reflow layer 510) to fill the shallow trench isolation trenches (i.e., the narrow STI trenches 305 and the wide STI trenches 310) in the substrate 105, such that doped material of the doped layer 210 at least partially fills the shallow trench isolation trenches (i.e., the narrow STI trenches 305 and the wide STI trenches 310). An example in depicted in FIG. 5.

At block 835, the undoped oxide layer 605 is formed to completely fill the shallow trench isolation trenches (i.e., the narrow STI trenches 305 and the wide STI trenches 310). An example is depicted in FIG. 6.

At block 840, the spacers 205 on the fin sidewalls and the hardmask 115 on top of the fins 110 are removed. FIG. 7 depicts an example.

The doped layer 210 includes oxide material. The spacers 205 include nitrides. The punchthrough stop doping region 405 is self-aligned underneath the fins 110. The dopants include boron, and the punchthrough stop doping region 405 includes the boron as the dopants.

The fins 110 are formed of the substrate material of the substrate 105. The shallow trench isolation trenches include one or more wide STI trenches 310 and one or more narrow STI trenches 305. The one or more narrow trenches 305 are between a fin pitch of the fins 110. The one or more narrow STI trenches 305 have a higher vertical thickness of the doped material 510 from the doped layer 210 than a vertical thickness of doped material 510 in the one or more wide STI trenches 210.

The walls, forming the one or more narrow trenches 305, are in the punchthrough stop doping region 405.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming punchthrough stop (PTS) doping for bulk fin field effect transistors, the method comprising:
   forming fins on a substrate, wherein the fins have a hardmask on top;
   forming spacers on fin sidewalls of the fins;
   forming a doped layer on spacer sidewalls of the spacers, wherein the doped layer includes dopants;
   etching the substrate to form shallow trench isolation trenches in the substrate;
   annealing to drive the dopants from the doped layer into the substrate including lower portions of the fins, thereby forming a punchthrough stop doping region, wherein an upper portion of the fins is protected from the dopants by the spacers on the fin sidewalls and the hardmask on top of the fins;
   annealing to reflow the doped layer to fill the shallow trench isolation trenches in the substrate, such that doped material of the doped layer at least partially fills the shallow trench isolation trenches;
   forming an undoped oxide layer to completely fill the shallow trench isolation trenches; and
   removing the spacers on the fin sidewalls and the hardmask on top of the fins.

2. The method of claim 1, wherein the doped layer includes oxide material.

3. The method of claim 1, wherein the spacers include nitrides.

4. The method of claim 1, wherein the punchthrough stop doping region is self-aligned to the spacers.

5. The method of claim 4, wherein the dopants include boron, phosphorus, or arsenic;
   wherein the punchthrough stop doping region includes the boron, the phosphorus, or the arsenic, as the dopants.

6. The method of claim 1, wherein the fins are formed of the substrate.

7. The method of claim 1, wherein the shallow trench isolation trenches include one or more wide trenches and one or more narrow trenches.

8. The method of claim 7, wherein the one or more narrow trenches are between a fin pitch of the fins.

9. The method of claim 8, wherein the one or more narrow trenches have a higher vertical thickness of the doped material from the doped layer than a vertical thickness of doped material in the one or more wide trenches.

10. The method of claim 7, wherein walls, forming the one or more narrow trenches, are in the punchthrough stop doping region.

* * * * *